United States Patent [19]
Atoh et al.

[11] Patent Number: 5,516,297
[45] Date of Patent: May 14, 1996

[54] SURFACE MOUNT ELECTRICAL DEVICES

[75] Inventors: Koyoshi Atoh, Tokyo; Etsuro Doi, Saitama; Shoichi Mochizuki; Mazakazu Koiso, both of Tama, all of Japan

[73] Assignee: Kel Corporation, Tokyo, Japan

[21] Appl. No.: 314,915

[22] Filed: Sep. 28, 1994

[30] Foreign Application Priority Data

Sep. 28, 1993 [JP] Japan ................................ 5-571134

[51] Int. Cl.$^6$ ...................................................... H01R 9/09
[52] U.S. Cl. .............................................. 439/79; 439/83
[58] Field of Search .................................. 439/83, 79, 80

[56] References Cited

U.S. PATENT DOCUMENTS 5,173,056  12/1992  Kniese et al. ..................... 439/79 OR
5,201,662   4/1993  Roche ................................ 439/79 OR
5,281,152   1/1994  Takahashi et al. ................. 439/79 OR Primary Examiner—Larry I. Schwartz
Assistant Examiner—Daniel Wittels
Attorney, Agent, or Firm—Robert W. J. Usher

[57] ABSTRACT

A surface mount electrical connector having lead portions of first and second series of terminals extending in alternating closely spaced parallel relation across a circuit board from a rear face of a connector housing. The lead portions have transverse soldering portions on respective free ends and the lead porions of the second series are longer than those of the first series and the lead portion of each series are of equal length so that the soldering portions of the first and second series are located in first and second rows with the first row being closer to the housing than the second row. The soldering potions of the first row have respective upstanding heater engaging portions so that the heater can be brought into engagement therewith without interfering with adjacent lead portions or with soldering portions of the other row.

4 Claims, 5 Drawing Sheets

SURFACE MOUNT ELECTRICAL DEVICES

FIELD OF THE INVENTION

The invention relates to electrical devices such as electrical connectors for connection to circuit boards by a surface mount reflow solder technique.

BACKGROUND OF THE INVENTION

An example of a conventional electrical connector 60 for connecting to a circuit board B by a surface mount reflow soldering technique is shown in FIG. 6 and comprises an insulating housing or body 61 having a bottom circuit board engaging face for mounting against a circuit board with an adjacent, rear face 60a of the housing upstanding from the circuit board B. A first and a second series of terminals are retained in the housing with respective lead portions 63 extending from the rear face 60a adjacent the board engaging face in closely spaced, parallel relation across the circuit board with the respective lead portions of the first series alternating with the respective lead portions of the second series and having transverse soldering portions at respective free ends thereof for connection to respective conductive paths 65 on the circuit board. The lead portions of the first series are of equal length and shorter than the lead portions of the second series so that the respective soldering portions of the first and second series are located in respective rows I and II with the row of soldering portions of the second series being further away from the housing than the row of soldering portions of the first series.

A disadvantage of the prior connector is that it is not easy to melt the solder joining the end of only a single soldering portion of a damaged terminal portion to the circuit board without disturbing other, adjacent, lead portions, even by using small ultrasonic or pulse heaters, as the lead portions of both series are at common above-board height and the pitch of the lead portions has narrowed in recent years in order to satisfy the inexorable demand for both increasing miniaturization and complexity.

SUMMARY OF THE INVENTION

One object of the invention is to a surface mounted electronic device which affords easier access of a heating tool to individual soldering portions to enable reheating or initial reflow soldering thereof without interfering with adjacent soldering or lead portions.

According to one aspect of the invention, the lengths of soldering portions of the first row which are which are closer to the housing or body are increased so that their above board height is greater than those of the second row, further away from the housing or body, enabling engagement of the higher soldering portions by a soldering or reheating tool without the tool causing interference to adjacent lead soldering or lead portions.

Preferably, soldering portions of both series have board engaging portions of equal height depending from respective free ends and the respective soldering portions of the first series have heating tool engaging projections upstanding from the depending portions, maintaining the head of the heating tool spaced above the lead portions during the application of heat.

BRIEF DESCRIPTION OF THE DRAWINGS

A specific embodiment of the invention will now be described by way of example only and with reference to the accompanying drawings in which.

DETAILED DESCRIPTION

Figure 1:
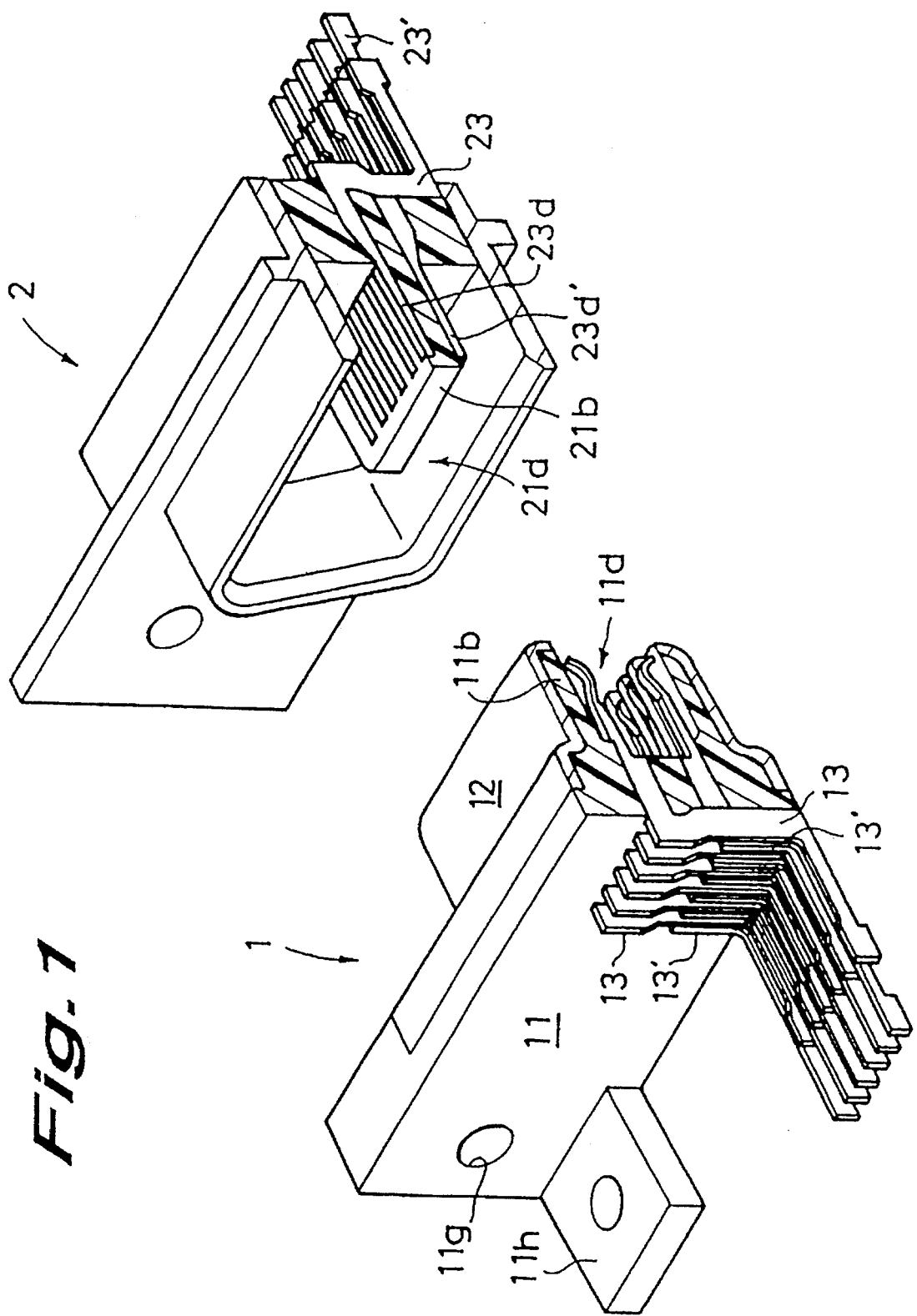
FIG. 1 is a fragmentary, perspective view of first and second, female and male, connector members aligned for mating.
Figure 2:
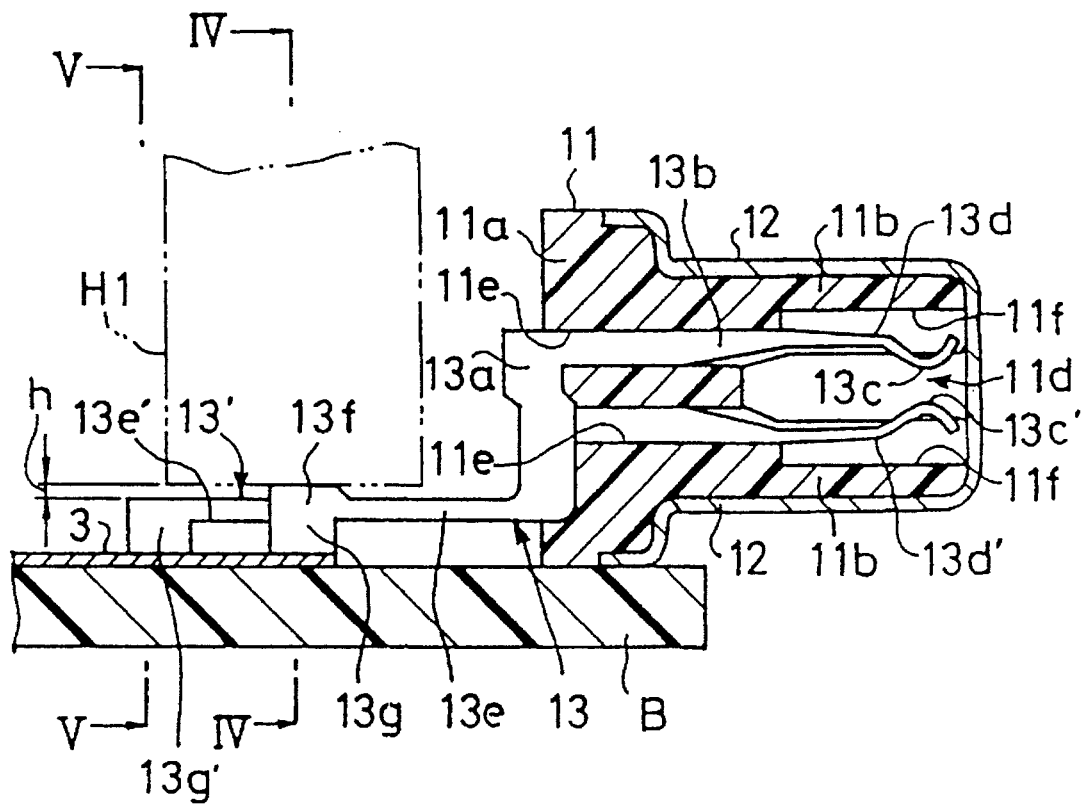
FIG. 2 is a cross-sectional view of the first, female connector member shown in FIG. 1.

As shown in FIGS. 1 and 2, a surface mount female connector member 1 comprises a housing 11 molded in a rectanguloid shape from insulating plastic material and two series of terminals 13, 13', respectively press fitted therein.

The housing 11 comprises a rear face 11a which upstands from a bottom or bed from which a generally rectangularly annular hood portion 11b extends forward to a mating face and providing between them a mating opening 11d surrounded by a metal shield or cover 12. Two series of terminal receiving sockets 11e located in upper and lower rows communicating forward with corresponding, respective terminal receiving grooves are formed in the hood interior and extend to the mating face. Threaded, fastening screw receiving sockets 11g are formed adjacent respective opposite longitudinal ends of the upstanding portion 11a and apertured circuit board mounting flanges extend rearward therefrom.

The terminals 13, 13' of the first and second series are stamped and formed in one piece from sheet metal stock and comprise medial body portions 13a, 13a', respectively, which extend vertical of the rear face of the housing with body portion 13a being longer than body portion 13b, anchoring portions 13b,13b', respectively, extending forward from respective upper ends and press fitted in respective sockets 11e of upper and lower rows, and upper and lower rows of contact portions 13d, 13d', respectively, received in respective upper and lower grooves 11f and which terminate at the mating face in oppositely convex contact protuberances 13c, 13c', respectively Lead portions 13e, 13e' extend from lower ends of respective body portions 13a, 13a', respectively, rearward across the circuit board in closely spaced apart parallel relation at a common height with lead portions 13e alternating with lead portions 13e. The lead portions 13e' are of a common length and longer than lead portions 13e, also of a common length and terminate rearward in respective transverse soldering portions 13g, 13g' which are located as first and second rows and have portions depending between respective lead portions and the circuit board. The soldering portions 13e have heating tool engaging projections 13f which upstand by a distance h from the ends of respective lead portions 13e.

Figure 3:
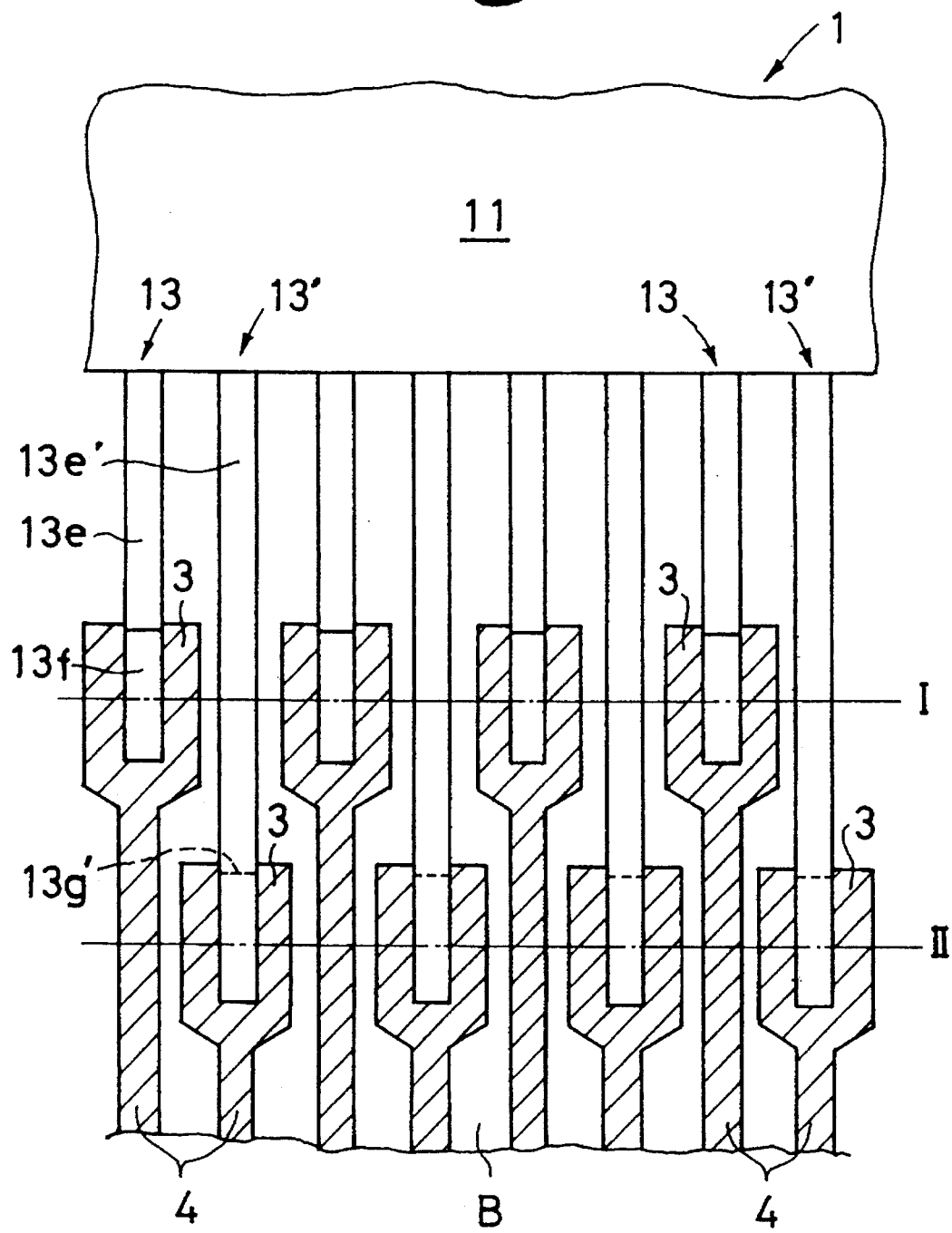
FIG. 3 is a fragmentary, schematic plan view of the connector member shown in FIG. 2.

The terminals are assembled with the housing by press fitting anchoring portions 13b, 13b' from the rear of the housing into respective anchoring sockets 11e so that the respective contact portions are located in respective grooves 11f and the lead portions 13e, 13e' extending rearward of the housing, as shown in FIG. 3, with the first and second series of soldering portions 13g, 13g' forming rows I and II.

The housing is mounted on the circuit board by means of screws (not shown) received in flange 11h with respective soldering portions engaging cream solder pre-deposited on broadened ends or pads 3 of the respective conductive paths 4.

Figure 4:
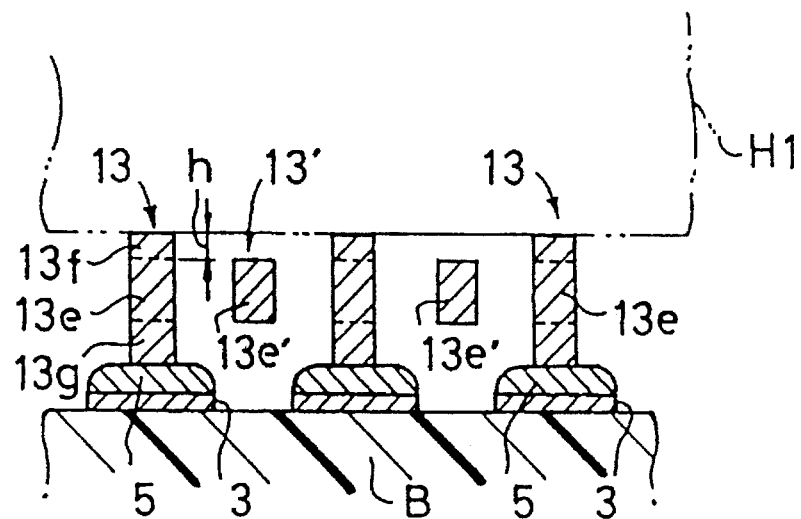
FIG. 4 is a cross-sectional view taken along line IV—IV of FIG. 2.

A wide, ultrasonic or pulse type heater H1 is engaged with the upper surfaces of the tool engaging projections 13f of the first lead portions 13e, as shown by the broken lines in FIGS. 2 and 4, and heated thereby to effect solder reflow and embedment of the tips of portions 13g the subsequently hardened soldering portions 13e in the cream solder without engagement with adjacent lead portions or soldering portions 13g' which are at a lower level separate from the level of the heater by the amount h.

The pulse heater is then moved rearward and applied the respective upper ends of soldering portions 13g' connecting them to the circuit board by the same process. Thus mounting is acheived by a two step reflow soldering process.

The male connector 2 is similarly constructed to the female connector 1 and comprises a housing 21 and two series of terminals 23,23' each stamped and formed in one piece, and respectively press fitted therein.

The housing 21 has a mating opening of complementary shape to the hood at a front and a central rib 21b, on respective upper and lower surface of which respective contact portions 23d of respective terminal 23 are located. On mating the connectors 1 and 2 the rib is forcibly received between the upper and lower rows of contact potions 13d and 13d', respectively which resile apart to provide electrical contact.

However, if an individual contact potion is overstressed, an unreliable connection can result and the individual terminal must be replaced which require melting the individual solder join to the circuit board.

Figure 5:
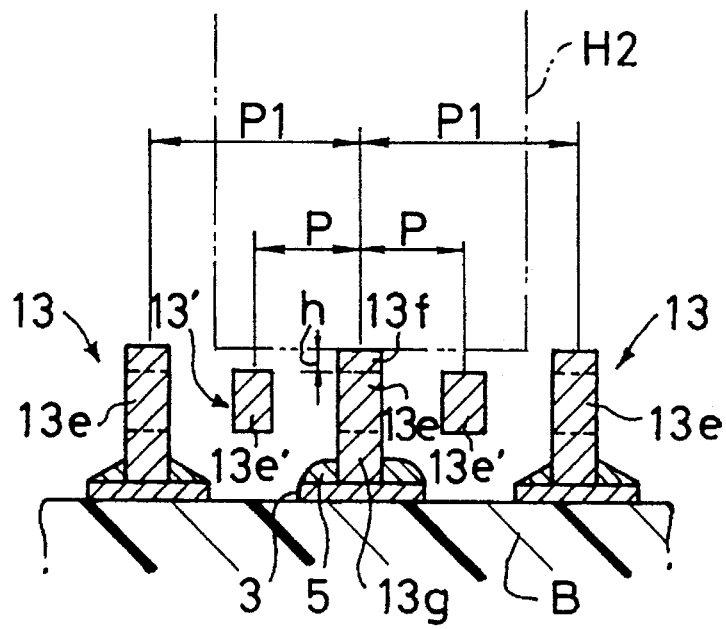
FIG. 5(A) is a similar view to FIG. 4.
FIG. 5(B) is a cross-sectional view taken along line V—V of FIG. 2.
Figure 5:
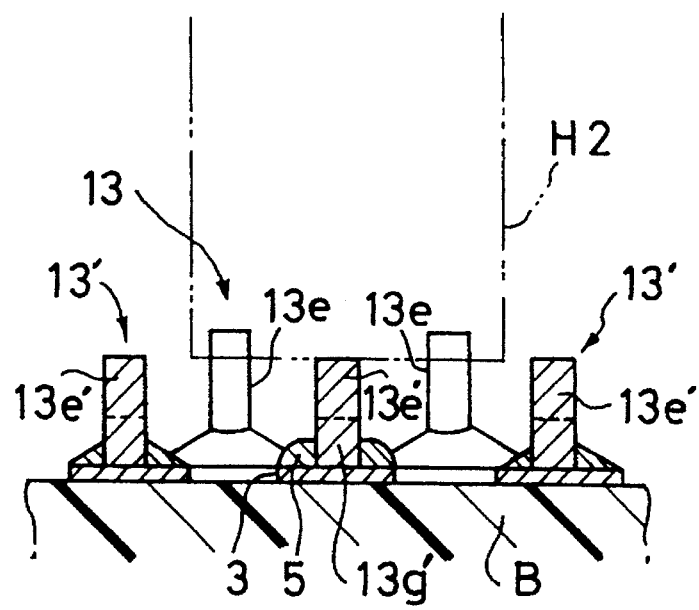
Figure 6:
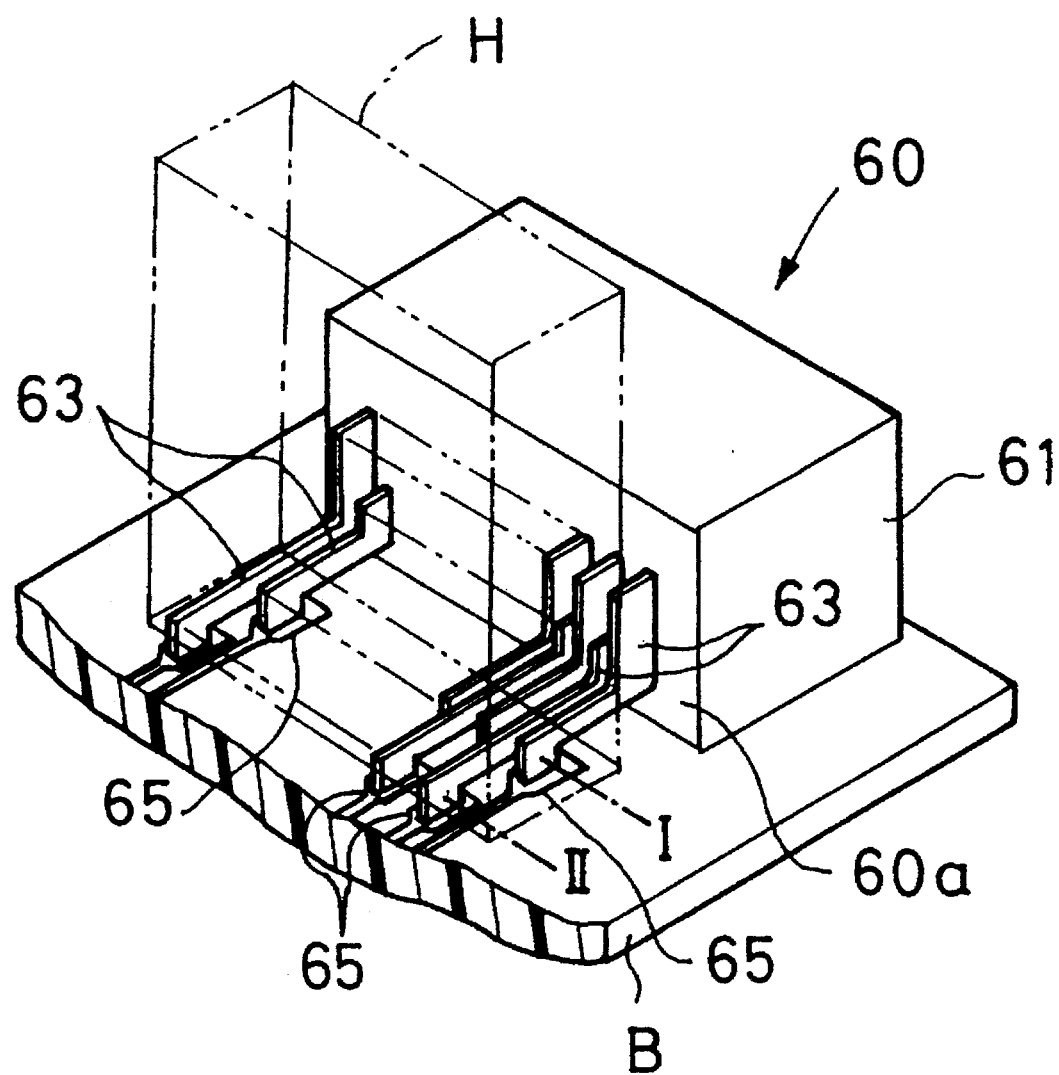
FIG. 6 is a perspective, schematic view of a conventional surface mounted connector member.

As shown in FIGS. 5(A) and 5(B), where a terminal of the first series is to be replaced, a narrow pulse heater H2 is applied to the upper tip of the projection 13f without the risk of engaging an adjacent soldering portion 13e' of the second series as it is located at a lower level, irrespective of the width of the heater, (even if greater than twice the pitch P of the terminals of the first and second series). However, if the width of the heater is greater than twice the pitch P1 (equal to 2×P) between the terminals of the first series, it will touch an adjacent first terminal. Thus, a heater having a smaller width must be selected.

If a strained terminal is one of the second series, as shown in FIG. 5(B), a pulse heater placed against the soldering portion 13g' of the faulty individual terminal need not extend into the vicinity of any of the soldering portions 13g enabling solder melt and replacement of only the individual terminal without affecting other terminals of the first row.

I claim:

1. An electrical device for connecting to a circuit board by a surface mount reflow soldering technique comprising an insulating housing having a circuit board engaging face for mounting against a circuit board with an adjacent face of the housing upstanding from the circuit board;

a first and a second series of terminals retained in the housing and having respective lead portions extending from the housing adjacent the board engaging face in a common direction across the circuit board at a common above-board height and in closely spaced apart relation with transverse soldering portions at respective free ends thereof, the lead portions of the first series alternating with the lead portions of the second series and the lead portions of the first series being of common length and the lead portions of the second series also being of common length and longer than the lead portions of the first series so that their respective soldering portions are located in respective rows with the soldering portions of the second series being further away from the housing than the soldering portions of the first series; the soldering portions of the first series being longer than the soldering portions of the second series and thereby of greater above-board height than the soldering portions and lead portions of the second series so that a flat head of a soldering tool can be brought into soldering engagement with the soldering portions of the first series without engaging the lead and soldering portions of the second series.

2. An electrical device according to claim 1 wherein soldering portions of both series terminals have board engaging portions of equal height depending from respective free ends and the respective soldering portions of the first series have solder tool engaging projections upstanding from the depending portions maintaining the head of the solder tool spaced above the lead portions during reflow soldering.

3. An electrical device for connecting to a circuit board by a surface mount reflow soldering technique comprising an insulating housing having a circuit board engaging face for mounting against the circuit board with an adjacent face of the housing upstanding from a circuit board;

a first and a second series of terminals retained in the housing and having respective lead portions extending from the housing adjacent the board engaging face in a common direction across the circuit board in closely spaced apart relation with transverse soldering portions at respective fee ends thereof, the lead portions of the first series alternating with the lead portions of the second series and the lead portions of the second series being longer than the lead portions of the first series so that the soldering portions of the second series are located further away from the housing than the soldering portions of the first series; the soldering portions of the first series being longer than the soldering portions of the second series and thereby of greater above-board height than the soldering portions and lead portions of the second series so that a flat head of a soldering tool can be brought into soldering engagement with the soldering portions of the first series without engaging the lead and soldering portions of the second series.

4. An electrical device according to claim 3 wherein the transverse soldering portions have depending lower circuit board engaging portions extending between respective leads and the circuit board of a common height for locating the lead portions of both series at a common above-board height and transverse soldering portions of the first series have solder tool engaging projections upstanding from respective depending portions whereby transverse portions have upper solder tool engaging ends and lower circuit board engaging ends for maintaining the head of the solder tool spaced above the lead portions during reflow soldering.

\* \* \* \* \*